Sept. 11, 1962 J. B. MERRILL ET AL 3,054,067

TRANSISTOR SIGNAL AMPLIFIER CIRCUIT

Filed Sept. 10, 1954

INVENTORS
John B. Merrill &
Albert Macovski
BY H. L. Newton
ATTORNEY

United States Patent Office 3,054,067

Patented Sept. 11, 1962

3,054,067

TRANSISTOR SIGNAL AMPLIFIER CIRCUIT

John B. Merrill, Rutherford, N.J., and Albert Macovski, Massapequa, N.Y., assignors to Radio Corporation of America, a corporation of Delaware Filed Sept. 10, 1954, Ser. No. 455,104
13 Claims. (Cl. 330—15)

This invention relates generally to signal amplifier circuits and relates particularly to push-pull signal amplifier circuits in which semiconductor devices are utilized.

The many advantages of the mode of amplifier operation known as push-pull operation are generally known. Two important advantages are the cancellation of even-order harmonics caused by nonlinearities in the amplifier device used, and the elimination of unbalanced direct energizing currents in the output load element. The requirement for push-pull operation in a Class A amplifier is that when the current increases in one of the two amplifier devices in response to an input signal, the current flow in the other amplifier device must simultaneously decrease. In a Class B amplifier, the term push-pull designates a type of operation in which two amplifier devices provides alternately operative parallel signal paths. This requirement is met in push-pull operated amplifiers which utilize electron discharge devices by providing input signals to the two devices in 180° phase relation. Output signals from the two devices are then additively coupled, usually in an output transformer.

Semiconductor devices such as transistors have also been used in push-pull amplifiers. A pair of semiconductor devices of like conductivity type (i.e. two P-N-P transistors or two N-P-N transistors) may be utilized in a push-pull amplifier in a manner somewhat similar to that in which electron discharge devices or vacuum tubes are used. Alternatively, a pair of transistors of opposite conductivity types may be connected (i.e. N-P-N and a P-N-P transistor) to provide push-pull operation while still retaining some of the features of a single-ended amplifier, as shown in an article entitled "Symmetrical Properties of Transistors and Their Applications" by George C. Sziklai, Proc. I.R.E., pp. 717–724, vol. 41, June 1953.

As noted in this article, a supply voltage source which is center-tapped for signals is required for the operation of the particular type of amplifier discussed. A supply voltage source without a center-tap may be utilized if a divider network is connected across the supply voltage source, the tap of the divider being returned to circuit ground.

Accordingly, it is a primary object of this invention to provide an improved push-pull signal amplifier circuit to effectively utilize semiconductor devices.

It is a further object of the present invention to provide an improved signal amplifier circuit employing transistors of opposite conductivity types efficiently to utilize push-pull operation.

It is another object of this invention to provide an improved push-pull semiconductor signal amplifier circuit which is capable of supplying high power output.

It is a still further object of this present invention to provide an improved signal amplifier circuit utilizing transistors of opposite conductivity type in which push-pull output signals are derived in response to a single-ended input signal.

Amplifier circuits in accordance with the present invention utilize a first and a second pair of transistors, each pair consisting of transistors of opposite conductivity types. The collector-emitter paths of the transistors comprising each pair are connected serially between the terminals of a source of energizing potential. Energizing currents flow through the two pairs of transistors in parallel. An output circuit is connected between the junction of the collector-emitter paths of one pair and the similar junction of the other pair. A source of input signals is coupled in common to the base electrodes of the first pair of transistors coupled in common and in common to the base electrodes of the second pair of transistors coupled in common.

In one embodiment of the present invention, the base electrodes of one pair of transistors are coupled to a point of substantially fixed reference potential or ground thereby to provide a single-ended input circuit. In another embodiment of the present invention, balanced input signals are applied between the base electrodes of the two pairs of transistors.

Since the transistors of each pair are of opposite conductivity types and since energizing current flows through the collector-emitter path of these transistors in series, two like elements of each transistor of a pair will be connected together. Thus each pair of transistors taken individually provides push-pull amplification of the input signal. This amplifier circuit is thus seen to act as a bridge network which the input signal serves to unbalance, thereby to provide signals to a load element or utilization device.

It will be appreciated that the circuit of the present invention is operable with transistors connected in any of the three transistor configurations commonly designated as the common emitter, the common collector and the common base configurations.

The novel features that are considered characteristic of this invention are set forth with particularity in the appended claims. The invention itself, however, both as to its organization and method of operation as well as additional objects and advantages thereof, will be best understood from the accompanying drawing, in which:

Figure 1:
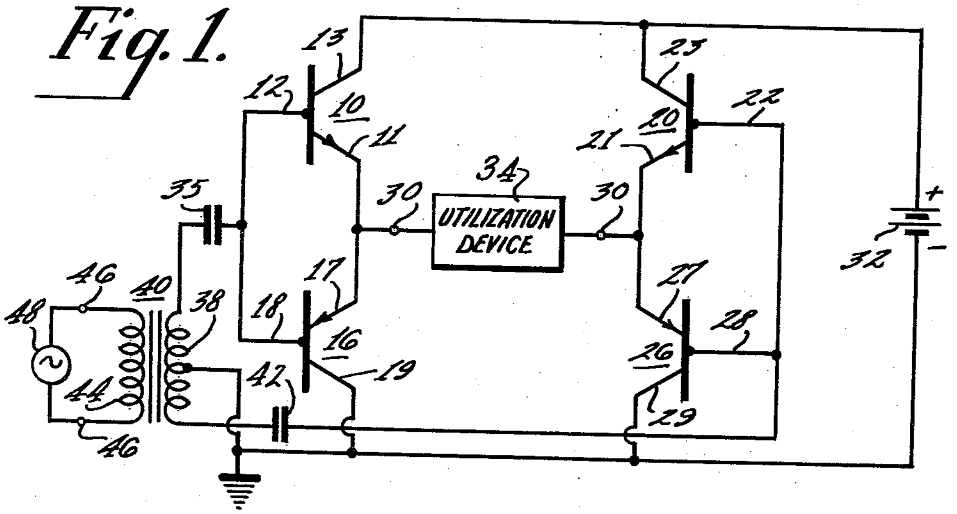
FIGURE 1 is a schematic circuit diagram of a Class B grounded collector amplifier circuit in accordance with the present invention.

Referring now to the drawing wherein like elements are designated by like reference numerals throughout the various figures and referring particularly to FIGURE 1, a first pair of transistors 10 and 16 have their emitter electrodes, 11 and 17 respectively, connected in common with one of a pair of output terminals 30. The first pair of transistors 10 and 16 are of opposite conductivity type, the transistor 10 being shown for purposes of illustration as an N-P-N transistor, and the transistor 16 being shown as a P-N-P transistor. The collector electrode 13 of the transistor 10 is connected to the positive terminal of a direct current source 32. The collector electrode 19 of the transistor 16 is connected to the negative terminal of the direct current source 32, thereby defining a series direct current path through the direct current source 32, the transistor 10, and the transistor 16.

A similar direct current path is formed by a second pair of transistors 20 and 26, the emitter electrodes of which are connected in common to the other of the pair of output terminals 30. The collector electrode 23 of the transistor 20 is connected to the positive terminal of the direct current source 32 and the collector electrode 29 of the transistor 26 is connected to the negative terminal of the direct current source 32. The transistor 20 is thus seen to be of the N-P-N type while the transistor 26 is of the P-N-P type. A utilization device 34 is connected between the pair of output terminals 30. Output signals are thus developed between the emitter electrodes 11 and 17 of the first pair of transistors and the emitter electrodes 21 and 27 of the second pair of transistors.

The base electrodes 12 and 18 of the first pair of transistors 10 and 16 are connected together and in turn are coupled through a coupling capacitor 35 to one end of the secondary winding 38 of an input transformer 40. The base electrodes 22 and 28 of the second pair of transistors 20 and 26 are likewise connected together and are coupled through the coupling capacitor 42 to the opposite end of the secondary winding 38. A center tap on the secondary winding 38 is connected to a point of substantially fixed reference potential or ground, to which either terminal of the direct current source 32 may also be connected. For purposes of illustration, the negative terminal of the direct current source 32 is connected to ground. A primary winding 44 of the input transformer 40 is coupled to a pair of input terminals 46 to which input signals may be applied from any convenient signal source 48.

The input transformer 40 provides a balanced source of input signals to be applied between the base electrodes of the first and second pairs of transistors. An input transformer is shown for illustrative purposes only and any suitable source of balanced input signals such as a phase inverter may also be used. It is further to be noted that the coupling capacitors 35 and 42 would not be required when an input transformer is used if the center-tap of the secondary winding were returned to a center-tap on the direct current source.

Under conditions of zero input signal, the current drawn from the direct current source 32 by the first and second pair of transistors will be very small, by virtue of the direct connection between the base electrodes of each of the pairs of transistors. The amplifier circuit is thus seen to be operating in Class B wherein the output circuit current of the transistors increases only upon the application of input signals.

In order to illustrate the operation of the circuit of the present invention it will be assumed that a positive signal is applied to the pair of input terminals 46. A positive signal is coupled through the coupling capacitor 35 to the base electrodes 12 and 18 of the first pair of transistors 10 and 16, and a negative signal is applied through the coupling capacitor 42 to the base electrodes 22 and 28 of the second pair of transistors 20 and 26. The positive signal on the base electrode 12 causes the collector current of the transistor 10 to increase. This same signal applied to the base electrode 18 tends to cause the collector current of the transistor 16 to decrease. The zero signal collector currents of the transistors 10 and 16 are very low, however, so that the transistor 16 is driven to cut-off during this portion of the input signal cycle.

Simultaneously, a negative signal is applied to the coupling capacitor 42 to the base electrodes 22 and 28 of the transistors 20 and 26. This negative signal causes the collector current of the transistor 26 to increase and tends to cause the collector current of the transistor 20 to decrease. The transistor 20 is therefore driven to cut-off during this portion of the input signal cycle, and current from the direct current source 32 flows through the collector-emitter path of the transistor 10, through the utilization device 34 and is returned to the direct current source 32 through the collector-emitter path of the transistor 26. On the next half cycle of input signal, the transistors 10 and 26 are driven to cut-off, and current flows from the direct current source 32 through the transistor 20, through the utilization device 34 in the opposite direction, and is returned to the direct current source 32 through the collector-emitter path of the transistor 16. The amplifier circuit is thus connected to operate as a bridge circuit which is unbalanced by the input signal.

Figure 2:
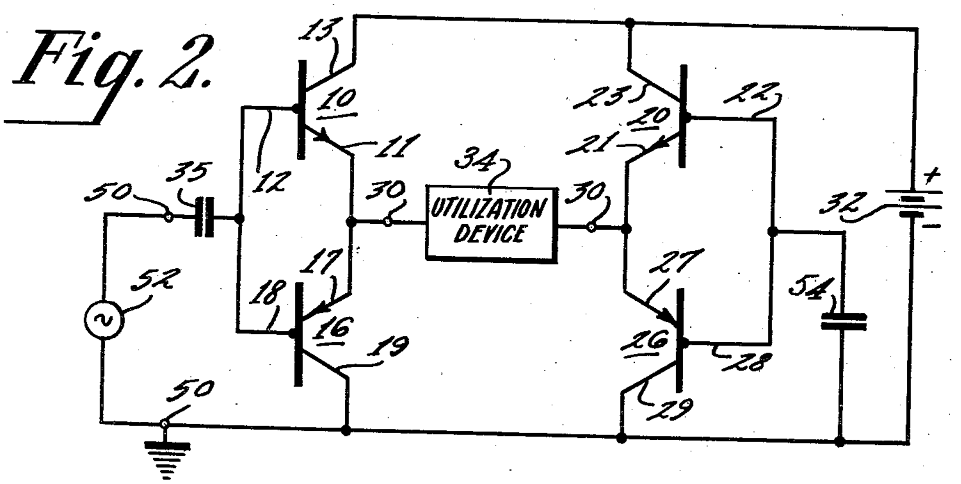
FIGURE 2 is a schematic circuit diagram of an amplifier circuit having a single-ended input circuit in accordance with the present invention.

Referring now to FIGURE 2, an amplifier circuit in accordance with the present invention includes a first pair of transistors 10 and 16 having their respective emitter electrodes 11 and 17 connected in common to one of a pair of output terminals 30. The transistor 10 is shown for purposes of illustration to be of the N-P-N type and the transistor 16 of the P-N-P type. The collector electrode 13 of the transistor 10 is connected to the positive terminal of a direct current source 32 and the collector electrode 19 of the transistor 16 is connected to the negative terminal of the direct current source 32. Input signals applied from an input signal generator 52 to a pair of input terminals 50 are coupled from one of the pairs of input terminals through a coupling capacitor 35 to a pair of base electrodes 12 and 18 connected in common, of the pair of transistors 10 and 16 respectively. The other of the pair of input terminals is connected to the negative terminal of the direct current source 32 which is in turn connected to ground. A second pair of transistors 20 and 26 include a pair of emitter electrodes 21 and 27 respectively, which are connected in common to the other of the pair of output terminals 30. The transistor 20 is of the N-P-N type and the transistor 26 is of the P-N-P type. The collector electrode 23 of the transistor 20 is connected to the positive terminal of the direct current source 32 and the collector electrode 29 of the transistor 26 is connected to the negative terminal of the direct current source 32. A pair of base electrodes 22 and 28 of the second pair of transistors 20 and 26 are connected together and are coupled to ground through a capacitor 54. A utilization device 34 is connected to the pair of output terminals 30.

The operation of this amplifier circuit of FIGURE 2 is similar to that of the amplifier circuit shown in FIGURE 1 to which reference is now also made. In the circuit of FIGURE 1 balanced input signals were applied to the base electrodes of each pair of transistors. In the circuit of FIGURE 2 on the other hand a single-ended signal is applied to the base electrodes 12 and 18, the base electrodes 22 and 28 being coupled to ground. The circuit of FIGURE 2 operates in Class B in the manner described with reference to the circuit of FIGURE 1.

If a positive input signal is applied to the circuit of FIGURE 2, the collector current of the P-N-P transistor 16 will tend to be reduced, thereby cutting off the transistor 16. The collector current of the transistor 10 will be increased, however, so that current will tend to flow from the direct current source 32, through the collector-emitter path of the transistor 10 and through the utilization device 34. This current will cause the voltage appearing at the emitter electrodes 21 and 27 of the second pair of transistors 20 and 26 to be biased positively relative to the zero signal condition. The collector current flowing in the transistor 20 will therefore tend to be reduced so that the transistor 20 is cut-off during this portion of the input signal cycle. The collector current of the transistor 26, however, will increase due to the aforementioned bias on the emitter electrode 27 thus current will flow from the direct current source 32 through the collector-emitter path of the transistor 10, through the utilization device 34, and will return to the direct current source 32 through the collector-emitter path of the transistor 26.

A negative input signal, applied from the input signal generator 52 to the pair of input terminals 50, is coupled through the coupling capacitor 35 to the pair of base electrodes 12 and 18. In this case the collector current of the P-N-P transistor 16 tends to increase while the collector current of the N-P-N transistor 10 tends to decrease. Current is thereby drawn through the utilization device 34 from the emitter electrode 21 of the N-P-N transistor 20 tending to increase the current flowing through the collector-emitter path of the transistor 20. Thus push-pull Class B operation is afforded in this circuit with the use of a single-ended input signal source.

In the amplifier circuits of FIGURE 1 and FIGURE 2 to which reference is jointly made, input signals are applied between the base and collector electrodes of the transistors. Thus the transistors of these two circuits are operated efficiently in the common or grounded collector configuration. Use of this configuration affords simplicity of circuits and is particularly but not solely adaptable to Class B operation. Class A operation may be obtained by utilization of suitable input circuit biasing methods which are well known.

Figure 3:
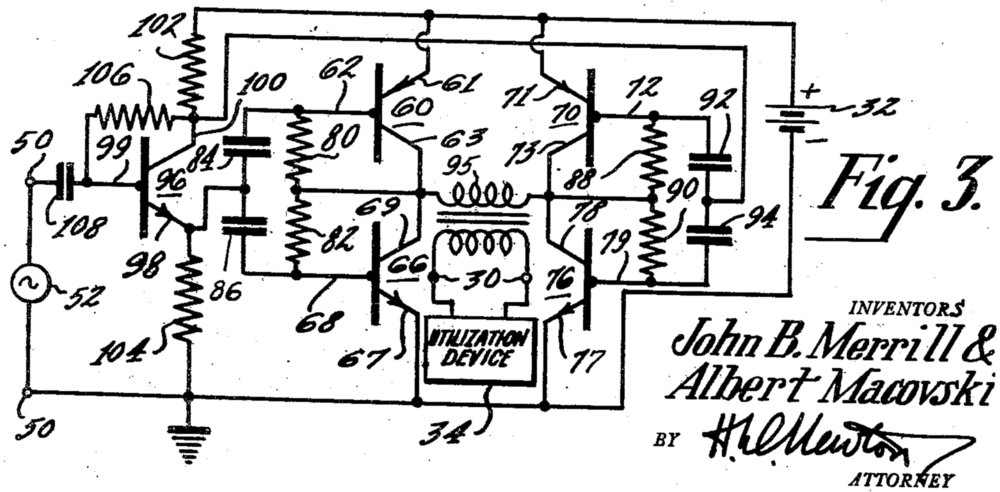
FIGURE 3 is a schematic circuit diagram of a common emitter Class A amplifier circuit in accordance with the present invention.

Reference is now made to FIGURE 3, in which a first pair of transistors 60 and 66 have a pair of collector electrodes 63 and 69 respectively, which are connected in common to the first primary winding of an output transformer 95. The transistor 60 is of the P-N-P type and has an emitter electrode 61 which is connected to the positive terminal of a direct current source 32. An emitter electrode 67 of the transistor 66 is connected to the negative terminal of the direct current source 32 which is connected to ground. A pair of bias resistors 80 and 82 are connected between the junction of the collector electrodes 63 and 69 and a pair of base electrodes 62 and 68 of the transistors 60 and 66 respectively. These resistors supply forward bias for the transistors 60 and 66 to provide Class A operation of these transistors. A second pair of transistors 70 and 76 including a pair of collector electrodes 73 and 78 which are connected in common to the other terminal of the primary winding to the output transformer 95. The emitter electrode 71 of the transistor 70 is connected to the positive terminal of the direct current source 32 and the emitter electrode 77 of the transistor 76 is connected to ground. Bias currents for the base electrodes 72 and 79 are provided by a pair of bias resistors 88 and 90 which are connected from the junction of the collector electrodes 73 and 78 to the base electrodes 72 and 79 respectively.

A phase inverter circuit including a transistor 96 having an emitter electrode 98, a base electrode 99, a collector electrode 100, and further includes an emitter load resistor 104 connected between the emitter electrode 98 and ground. A collector load resistor 102 is connected between the collector electrode 100 and the positive terminal of the direct current source 32 and a self bias resistor 106 is connected between the collector electrode 100 and the base electrode 99. Input signals from an input signal source 52 connected with a pair of input terminals 50 are applied through a coupling capacitor 108 to the base electrode 99. These signals are amplified by the transistor 96. Output signals from the phase inverter are divided from the emittter electrode 98 and the collector electrode 100 in opposite phase relation. The resistances of the resistors 104 and 102 are adjusted such that the magnitude of the signals appearing at the collector electrode 100 and the emitter electrode 98 are equal. Signals from the emitter electrode 98 are coupled to the base electrode 62 of the transistor 60 through a coupling capacitor 84 and are coupled to the base electrode 68 through another coupling capacitor 86. Signals from the collector electrode 100 are coupled to the base electrode 72, through a coupling capacitor 92 and are coupled to the base electrode 79 of the transistor 76 through a coupling capacitor 94.

Input signals of opposite polarities are thus applied in one phase to the base electrodes 62 and 68 and in opposite phase to the base electrodes 72 and 79. Aside from the fact that the first pair of transistors 60 and 66 and the second pair of transistors 70 and 76 operate in Class A or in other words are not cut-off during any portion of the signal cycle, operation is similar to that of the circuit of FIGURE 1.

For purposes of illustration a positive signal is assumed to be introduced in the base electrodes 62 and 68 while a negative signal is applied to the base electrodes 72 and 79. The positive signal applied to the base electrodes 62 and 68 causes the collector current of the transistor 60 to decrease and the collector current of the transistor 66 to increase. Likewise the negative signal applied to the base electrodes 72 and 79 will cause the collector current of the transistor 70 to increase and the collector current of the transistor 76 to decrease.

The four transistors are therefore simultaneously effective in causing the current to flow through the primary winding of the transformer 95 from the collector electrodes 73 and 78 to the collector electrodes 63 and 69.

The circuit of FIGURE 3 is thus seen to operate effectively in a bridge arrangement to provide Class A push-pull amplification of input signals.

It is noted that the first pair of bias resistors 80 and 82 and the second pair 88 and 90 are connected to provide feedback thereby to stabilize the operating point of the transistors and to improve the amplifier linearities. This bias system is shown only by way of illustration and bias current could be provided for the two pairs of transistors by other conventional methods which are well known.

The amplifier circuit of the present invention is thus seen to provide power amplification in a simple bridge type arrangement. Transistors of opposite conductivity type are utilized in the circuit to allow efficient and effective use of semiconductor devices in a unique push-pull arrangement. One embodiment of this invention is capable of supplying push-pull output signals in response to single-ended input signals. A conventional two-terminal power supply source may be utilized to supply energizing current to the amplifier circuit of the present invention.

What is claimed is:

1. A push-pull signal amplifier circuit comprising in combination, a first and a second pair of transistors, each of said pairs consisting of transistors of opposite conductivity type, each of the transistors of said pairs having a base electrode and two further electrodes, one of said two further electrodes of each of said transistors being a common electrode, the common electrodes of said transistors being like electrodes, said further electrodes defining current carrying paths, the current carrying paths of the transistors comprising each pair being connected in series relation, means for applying energizing currents to the two pairs of transistors in parallel, output circuit means connected between the other of said further electrodes of the transistors of one of said pairs and the other of said further electrodes of the transistors of the other of said pairs at intermediate points on the series connections, and input signal circuit means coupled between the base and common electrodes of at least one of the pairs of transistors in parallel.

2. A push-pull signal amplifier circuit comprising in combination, a first and second pair of semiconductor devices, each of said pairs including semiconductor devices of opposite conductivity type, each of said semiconductor devices including a base electrode, an output electrode and a common electrode, the output electrodes of each of said semiconductor devices being like electrodes and the common electrodes of said semiconductor devices being like electrodes, the base electrodes of said semiconductor devices of each of said pairs being connected together, a signal input circuit coupled between the base and common electrodes of at least one of said pairs, the output electrodes of each of said pairs being connected together, a signal output circuit coupled between the output electrodes of one of said pairs and the output electrodes of the other of said pairs, and means for applying energizing potential between the common electrodes of each of said pairs of semiconductor devices.

3. A signal amplifier circuit as defined in claim 2, wherein the signal input circuit includes a source of input signals which is balanced relative to said common electrodes.

4. A signal amplifier circuit as defined in claim 2, wherein the base electrodes of said other of said pairs of semiconductor devices are coupled to the common electrodes of said other of said pairs.

5. A push-pull signal amplifier circuit comprising in combination, a first and a second pair of transistors, each of said pairs including transistors of opposite conductivity type, the transistors of each of said pairs including base, emitter and collector electrodes, output circuit means coupled between parallel connected emitter electrodes of said first pair of transistors and parallel connected emitter electrodes of said second pair of transistors, signal input circuit means coupled between parallel connected base electrodes of said first pair of transistors and parallel connected base electrodes of said second pair of transistors for applying an input signal between the base and collector electrodes of each of said transistors, and means for applying energizing potential between the collector electrodes of each of said pairs of transistors.

6. A push-pull signal amplifier circuit comprising in combination, a first and second pair of transistors, each of said pairs consisting of transistors of opposite conductivity type, each of the transistors of said pairs including base, emitter and collector electrodes, output circuit means coupled between parallel connected collector electrodes of said first pair of transistors and parallel connected collector electrodes of said second pair of transistors, signal input circuit means coupled between parallel connected base electrodes of said first pair of transistors and parallel connected base electrodes of said second pair of transistors, and means for applying energizing potential between the emitter electrodes of each of said pairs of transistors.

7. A push-pull signal amplifier circuit comprising in combination, a first and second pair of transistors, each of said pairs consisting of transistors of opposite conductivity types, each of the transistors of said pairs having base, emitter and collector electrodes, a signal output circuit coupled between the collector electrodes connected in common of said first pair of transistors and the collector electrodes connected in common of said second pair of transistors, means for applying energizing potential between the emitter electrodes of each of said pairs of transistors, means for biasing the base electrodes of each of said transistors in a forward direction, a balanced input circuit including a pair of input terminals, one of said pair of input terminals being capacitively coupled to the base electrodes of one of said pair of transistors and the other of said pair of input terminals being capacitively coupled to the base electrodes of said second pair of transistors.

8. A push-pull signal amplifier circuit comprising, in combination, a first and second pair of transistors each including base, emitter and collector electrodes, each of said pairs including transistors of opposite conductivity types, the collector and emitter electrodes of each of said transistors defining a current carrying path, means providing a source of biasing potential including a pair of terminals, first means connecting the current carrying paths of said first pair of transistors in series between said pair of terminals such that the emitter electrode of one of said first pair of transistors is connected to the emitter electrode of the other of said first pair of transistors, second means connecting the current carrying paths of said second pair of transistors in series between said pair of terminals such that the emitter electrode of one of said second pair of transistors is connected to the emitter electrode of the other of said second pair of transistors, output circuit means connected between the emitter electrodes of said first pair of transistors and the emitter electrodes of said second pair of transistors, and input circuit means connected between the base and collector electrodes of each of said transistors.

9. A push-pull signal amplifier circuit comprising, in combination, a first and second pair of transistors each including base, emitter and collector electrodes, the collector and emitter electrodes of each of said transistors defining a current carrying path, each of said pairs including transistors of opposite conductivity types, means providing a source of biasing potential including a pair of terminals, first means connecting the current carrying paths of said first pair of transistors in series between said pair of terminals such that the collector electrode of one of said first pair of transistors is connected to the collector electrode of the other of said first pair of transistors, second means connecting the current carrying paths of said second pair of transistors in series between said pair of terminals such that the collector electrode of one of said second pair of transistors is connected to the collector electrode of the other of said second pair of transistors, output circuit means connected between the collector electrodes of said first pair of transistors and the collector electrodes of said second pair of transistors, and input circuit means connected between the base and emitter electrodes of each of said transistors.

10. A push-pull signal amplifier circuit comprising, in combination, first, second, third and fourth transistors each including a base, an emitter and a collector electrode, said first and third transistors being of one conductivity type, said second and fourth transistors being of an opposite conductivity type, means connecting the emitter electrode of said first transistor with the emitter electrode of said second transistor, means connecting the emitter electrode of said third transistor with the emitter electrode of said fourth transistor, means providing a source of biasing potential including a pair of terminals, means connecting the collector electrodes of said first and third transistors with one of said terminals, means connecting the collector electrodes of said second and fourth transistors with the other of said terminals, means providing a signal input circuit including a pair of terminals, means connecting one of the terminals of said input circuit with the other of said terminals of said source of biasing potential, means connecting the other of the terminals of said input circuit with the base electrodes of said third and fourth transistors for applying an input signal thereto, and means for deriving an output circuit from between the junction of the emitter electrodes of said first and second transistors and the junction of the emitter electrodes of said third and fourth transistors.

11. In an electronic circuit, a direct current source, a first and second pair of transistors, the transistors of a pair being of oppositely-conductive types, each said pair of transistors connected in series across said direct current source, a load impedance connected from a point intermediate one pair of transistors to a point intermediate the other pair of transistors, and means for simultaneously controlling the conduction of said transistors.

12. In an electronic circuit, a direct current source, a first and second pair of transistors, each transistor of a pair being of oppositely-conductive types, the collector-to-emitter circuit of each said pair of transistors connected in series across said direct current source, a load impedance connected from a point intermediate one pair of transistors to a point intermediate the other pair, means providing a control voltage connected to the bases of said transistors, said transistors operated so that while a transistor of each pair conducts, the other transistor of the pair is nonconducting.

13. In an electronic circuit, a direct current source a load impedance, a first current path comprising a first transistor connected in series with said direct current source and one side of said load and a second transistor connected from the other side of said load to the return path of said direct current source, a second current path comprising a third transistor connected in series circuit with said direct current source and said other side of said load, and a fourth transistor connected from said one side of said load to the return path of said direct current source, and means for placing a potential on the control elements of said transistors alternatively allowing the conduction of said first and second transistors or said third and fourth transistors.

References Cited in the file of this patent

UNITED STATES PATENTS

| | | |
|---|---|---|
| 2,428,295 | Scantlebury | Sept. 30, 1947 |
| 2,561,425 | Stachura | July 24, 1951 |
| 2,666,818 | Shockley | Jan. 19, 1954 |

OTHER REFERENCES

Article by Sziklai, Proc. I.R.E., June 1953, pp. 717–720.